United States Patent
Esfahlani et al.

(10) Patent No.: US 11,978,958 B2
(45) Date of Patent: May 7, 2024

(54) OPTICAL INSPECTION OF THE VARACTOR DIODES IN VARACTOR METASURFACE ANTENNA

(71) Applicant: Kymeta Corporation, Redmond, WA (US)

(72) Inventors: Hussein Esfahlani, Kirkland, WA (US); Cagdas Varel, Kirkland, WA (US); Mohsen Sazegar, Redmond, WA (US); Steven Howard Linn, Hillsboro, OR (US); Ryan Stevenson, Seattle, WA (US); Mohammad Ranjbarnikkhah, Redmond, WA (US); Seyed Mohamad Amin Momeni Hasan Abadi, Redmond, WA (US)

(73) Assignee: KYMETA CORPORATION, Redmond, WA (US)

( * ) Notice: Subject to any disclaimer, the term of this patent is extended or adjusted under 35 U.S.C. 154(b) by 147 days.

(21) Appl. No.: 17/889,096

(22) Filed: Aug. 16, 2022

(65) Prior Publication Data
US 2023/0058694 A1 Feb. 23, 2023

Related U.S. Application Data

(60) Provisional application No. 63/235,602, filed on Aug. 20, 2021.

(51) Int. Cl.
*G01R 29/08* (2006.01)
*G01J 1/42* (2006.01)
(Continued)

(52) U.S. Cl.
CPC ............ *H01Q 15/0086* (2013.01); *G01J 1/42* (2013.01); *G01R 29/0885* (2013.01); *G01R 31/2632* (2013.01)

(58) Field of Classification Search
CPC .... G01R 1/071; G01R 31/26; G01R 31/2601; G01R 31/2851; G01R 31/308;
(Continued)

(56) References Cited

U.S. PATENT DOCUMENTS

| 8,000,737 B2 | 8/2011 | Caimi et al. |
| 10,498,042 B2 * | 12/2019 | Kim .................. H01Q 15/0066 |

(Continued)

FOREIGN PATENT DOCUMENTS

| KR | 1020000012795 A | 3/2000 |
| KR | 1020210017533 A | 2/2021 |
| KR | 1020210055691 A | 5/2021 |

OTHER PUBLICATIONS

International Search Report and Written Opinion on The Patentability of Application No. PCT/US2022/041053 Mailed Dec. 21, 2022, 9 pages.

(Continued)

*Primary Examiner* — Tung X Nguyen
(74) *Attorney, Agent, or Firm* — Womble Bond Dickinson (US) LLP

(57) ABSTRACT

Methods and apparatuses for performing optical inspection of varactor diodes in an antenna are disclosed. In some embodiments, the method of testing an antenna having varactor diodes comprises: selecting a plurality of varactor diodes to be placed in a light emitting state; forward biasing the selected varactor diodes to a magnitude at which the selected varactor diodes are to emit light; and detecting one or more faulty varactor diodes of the selected varactor diodes based on their emitted light intensity.

24 Claims, 10 Drawing Sheets

(51) Int. Cl.
*G01R 31/26* (2020.01)
*H01Q 15/00* (2006.01)

(58) Field of Classification Search
CPC .............. G01R 31/311; G01R 31/2653; G01R 31/2884; G01R 31/305; G01R 31/307; G01R 31/66
See application file for complete search history.

(56) References Cited

U.S. PATENT DOCUMENTS

2020/0044326 A1    2/2020  Olfert et al.
2024/0069095 A1*  2/2024  Yap ........................ G01Q 20/02

OTHER PUBLICATIONS

I. Rouissi et al. Design of a Reconfigurable Patch Antenna Using Capacitive loading and Varactor Diode Study of Reconfigurable Square Patch Antenna Using Capacitive Loading, Nov. 14, 2014, 3 pages.
International Preliminary Report on Patentability received for PCT Patent Application No. PCT/US22/41053, mailed on Feb. 29, 2024, 6 pages.

\* cited by examiner

OPTICAL INSPECTION OF THE VARACTOR DIODES IN VARACTOR METASURFACE ANTENNA

RELATED APPLICATION

The present application is a non-provisional application of and claims the benefit of U.S. Provisional Patent Application No. 63/235,602, filed Aug. 20, 2021 and entitled "OPTICAL INSPECTION OF THE VARACTOR DIODES IN VARACTOR METASURFACE ANTENNA", which is incorporated by reference in its entirety.

FIELD OF THE INVENTION

Embodiments of the present disclosure are related to wireless communication; more particularly, to testing antennas radio-frequency (RF) radiating antenna elements using varactors.

BACKGROUND

Metasurface antennas have recently emerged as a new technology for generating steered, directive beams from a lightweight, low-cost, and planar physical platform. Such metasurface antennas have been recently used in a number of applications, such as, for example, satellite communication.

Metasurface antennas may comprise metamaterial antenna elements that can selectively couple energy from a feed wave to produce beams that may be controlled for use in communication. These antennas are capable of achieving comparable performance to phased array antennas from an inexpensive and easy-to-manufacture hardware platform.

In tunable and/or active metasurfaces where different p-n junction semiconductor components such as, for example, varactor diodes are employed, a reliable yet fast and efficient method is required to detect faulty elements and ensure that the number of defective diodes does not pass certain thresholds. In conventional testing methods, such as direct current/radio frequency (DC/RF) testing or performing a free space test (FST), each of the varactor diodes are reverse biased and their electrical characteristics (e.g., capacitance/resistance) are evaluated to determine the health of the varactor diodes. Due to the usage of the vast number of varactor diodes in the metasurface antenna, a conventional DC/RF pass/fail test for individual elements mounted over the metasurface is very difficult, time-consuming, and inefficient.

SUMMARY

Methods and apparatuses for performing optical inspection of varactor diodes in an antenna are disclosed. In some embodiments, the method of testing an antenna having varactor diodes comprises: selecting a plurality of varactor diodes to be placed in a light emitting state; forward biasing the selected varactor diodes to a magnitude at which the selected varactor diodes are to emit light; and detecting one or more faulty varactor diodes of the selected varactor diodes based on their emitted light intensity.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
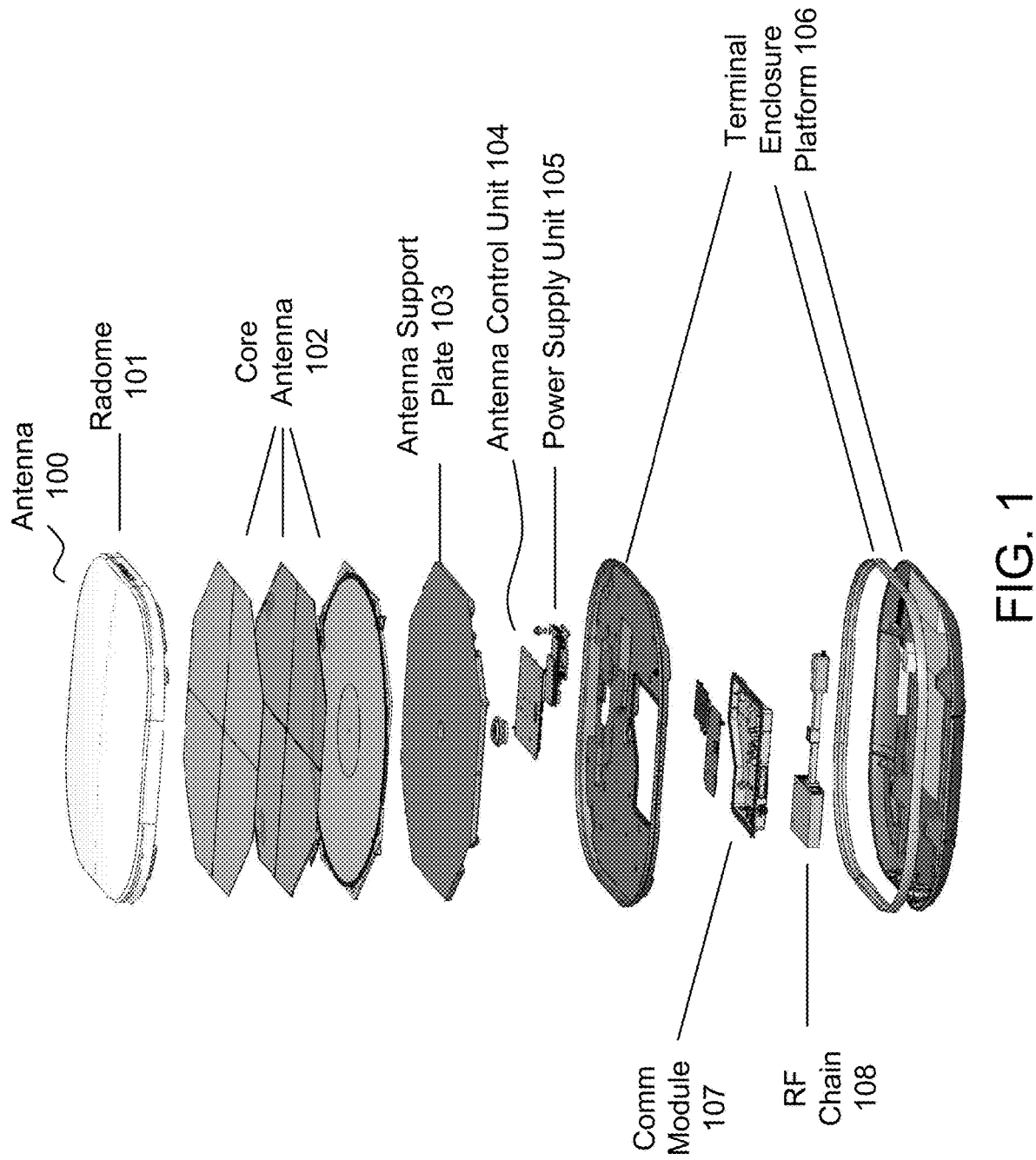
FIG. 1 illustrates an exploded view of some embodiments of a flat-panel antenna.

In the following description, numerous details are set forth to provide a more thorough explanation of embodiments of the present disclosure. It will be apparent, however, to one skilled in the art, that the embodiments may be practiced without these specific details. In other instances, well-known structures and devices are shown in block diagram form, rather than in detail, in order to avoid obscuring the present disclosure.

Embodiments disclosed herein include techniques for detecting faulty varactor diodes (or elements) based on optical inspection of individual varactors performed when the varactor diodes are set to a forward biased state. Because varactor diodes emit light in their forward biased state, this property can be leveraged for detection of faulty or broken varactor diodes. Such testing is particularly useful when testing a metasurface antenna having several hundred thousand tiny varactor diodes that are used as tuning elements.

In some embodiments, during use of a pixelated metasurface antenna setting, each varactor diode is individually and independently controlled by applying a reverse bias voltage to it; however, during testing, when the voltage on each varactor diode is changed to a forward bias voltage and passes a specific threshold voltage, the varactor diode starts to emit light, which is a very efficient and fast way to ensure that the p-n junction is in healthy state. Thus, for testing, the varactor diodes are forward biased and the optical characteristics of these varactor diodes represent and/or are evaluated to determine whether they are healthy or defective.

In some embodiments, a fast and efficient method is used to detect faulty varactor diodes individually after they are forward biased. For example, in one aspect, a combination of one or more cameras (e.g., high-resolution cameras) and one or more image processing algorithms are used to detect the location of defective varactor diodes fast and efficiently. More particularly, as the location of each varactor diode is predefined in the metasurface antenna surface, by exerting the forward bias to cause the varactor diodes to emit light, scanning the surface of the antenna with a high-resolution camera, and applying the image processing algorithm to the image produced by the camera, the number of the faulty varactor diodes as well as their location can be determined. Using this technique helps select the metasurface antennas that pass/fail based on the amount or intensity of light emitted by each forward-biased varactor diode. The amount or intensity of light emitted by each forward-biased varactor diode may be compared to a threshold (e.g., light/no light threshold, light intensity threshold, etc.) to determine whether the varactor diode is defective.

In some embodiments, the testing techniques disclosed herein can also be applied to identify defective varactors when they are on a wafer prior to dicing them into chips or being assembled onto the metasurface antenna backplane (or other device). In such embodiments, the optical inspection testing techniques may be used twice, once on varactor diodes on the wafer-level and then after the varactor diodes are assembled on the metasurface antenna backplane. Embodiments employing this double testing technique mitigate the risk of manufacturing metasurface antennas with damaged varactor diodes.

Thus, using an embodiment of the optical inspection techniques according to this disclosure with the varactor diodes in a forward biased state, faulty or defective varactor diodes may be detected in a quick and accurate manner.

Examples of Antenna Embodiments

The techniques described herein may be used with a variety of flat panel satellite antennas. Embodiments of such flat panel antennas are disclosed herein. In some embodiments, the flat panel satellite antennas are part of a satellite terminal. The flat panel antennas include one or more arrays of antenna elements on an antenna aperture.

In some embodiments, the antenna aperture is a metasurface antenna aperture, such as, for example, the antenna apertures described below. In some embodiments, the antenna elements comprise radio-frequency (RF) radiating antenna elements. In some embodiments, the antenna elements include tunable devices to tune the antenna elements. Examples of such tunable devices include diodes and varactors such as, for example, described in U.S. Patent Application Publication No. 20210050671, entitled "Metasurface Antennas Manufactured with Mass Transfer Technologies," published Feb. 18, 2021. In some other embodiments, the antenna elements comprise liquid crystal (LC)-based antenna elements, such as, for example, those disclosed in U.S. Pat. No. 9,887,456, entitled "Dynamic Polarization and Coupling Control from a Steerable Cylindrically Fed Holographic Antenna", issued Feb. 6, 2018, or other RF radiating antenna elements. It should be appreciated that other tunable devices such as, for example, but not limited to, tunable capacitors, tunable capacitance dies, packaged dies, microelectromechanical systems (MEMS) devices, or other tunable capacitance devices, could be placed into an antenna aperture or elsewhere in variations on the embodiments described herein.

In some embodiments, the antenna aperture having the one or more arrays of antenna elements is comprised of multiple segments that are coupled together. In some embodiments, when coupled together, the combination of the segments form groups of antenna elements (e.g., closed concentric rings of antenna elements concentric with respect to the antenna feed, etc.). For more information on antenna segments, see U.S. Pat. No. 9,887,455, entitled "Aperture Segmentation of a Cylindrical Feed Antenna", issued Feb. 6, 2018.

FIG. 1 illustrates an exploded view of some embodiments of a flat-panel antenna. Referring to FIG. 1, antenna 100 comprises a radome 101, a core antenna 102, antenna support plate 103, antenna control unit (ACU) 104, a power supply unit 105, terminal enclosure platform 106, comm (communication) module 107, and RF chain 108.

Radome 101 is the top portion of an enclosure that encloses core antenna 102. In some embodiments, radome 101 is weatherproof and is constructed of material transparent to radio waves to enable beams generated by core antenna 102 to extend to the exterior of radome 101.

In some embodiments, core antenna 102 comprises an aperture having RF radiating antenna elements. These antenna elements act as radiators (or slot radiators). In some embodiments, the antenna elements comprise scattering metamaterial antenna elements. In some embodiments, the antenna elements comprise both Receive (Rx) and Transmit (Tx) irises, or slots, that are interleaved and distributed on the whole surface of the antenna aperture of core antenna 102. Such Rx and Tx irises may be in groups of two or more sets where each set is for a separately and simultaneously controlled band. Examples of such antenna elements with irises are described in U.S. Pat. No. 10,892,553, entitled "Broad Tunable Bandwidth Radial Line Slot Antenna", issued Jan. 12, 2021.

In some embodiments, the antenna elements comprise irises (iris openings) and the aperture antenna is used to generate a main beam shaped by using excitation from a cylindrical feed wave for radiating the iris openings through tunable elements (e.g., diodes, varactors, patch, etc.). In some embodiments, the antenna elements can be excited to radiate a horizontally or vertically polarized electric field at desired scan angles.

In some embodiments, a tunable element (e.g., diode, varactor, patch etc.) is located over each iris slot. The amount of radiated power from each antenna element is controlled by applying a voltage to the tunable element using a controller in ACU 104. Traces in core antenna 102 to each tunable element are used to provide the voltage to the tunable element. The voltage tunes or detunes the capacitance and thus the resonance frequency of individual elements to effectuate beam forming. The voltage required is dependent on the tunable element in use. Using this property, in some embodiments, the tunable element (e.g., diode, varactor, LC, etc.) integrates an on/off switch for the transmission of energy from a feed wave to the antenna element. When switched on, an antenna element emits an electromagnetic wave like an electrically small magnetic dipole antenna. Note that the teachings herein are not limited to having unit cell that operates in a binary fashion with respect to energy transmission. For example, in some embodiments in which varactors are the tunable element, there are more than two tuning levels (e.g., 32 tuning levels, etc.). As another example, in some embodiments in which LC is the tunable element, there are more than two tuning levels (e.g., 16 tuning levels, etc.). In some embodiments, the maximum number of tuning levels is limited by the driver chip bit number.

A voltage between the tunable element and the slot can be modulated to tune the antenna element (e.g., the tunable resonator/slot). Adjusting the voltage varies the capacitance of a slot (e.g., the tunable resonator/slot). Accordingly, the reactance of a slot (e.g., the tunable resonator/slot) can be varied by changing the capacitance. Resonant frequency of the slot also changes according to the equation $f=1/2\pi\sqrt{LC}$ where f is the resonant frequency of the slot and L and C are the inductance and capacitance of the slot, respectively. The resonant frequency of the slot affects the energy coupled from a feed wave propagating through the waveguide to the antenna elements.

In particular, the generation of a focused beam by the metamaterial array of antenna elements can be explained by the phenomenon of constructive and destructive interference, which is well known in the art. Individual electromagnetic waves sum up (constructive interference) if they have the same phase when they meet in free space to create a beam, and waves cancel each other (destructive interference) if they are in opposite phase when they meet in free space. If the slots in core antenna 102 are positioned so that each successive slot is positioned at a different distance from the excitation point of the feed wave, the scattered wave from that antenna element will have a different phase than the scattered wave of the previous slot. In some embodiments, if the slots are spaced one quarter of a wavelength apart, each slot will scatter a wave with a one fourth phase delay from the previous slot. In some embodiments, by controlling which antenna elements are turned on or off (i.e., by changing the pattern of which antenna elements are turned on and which antenna elements are turned off) or which of the multiple tuning levels is used, a different pattern of constructive and destructive interference can be produced, and the antenna can change the direction of its beam(s).

In some embodiments, core antenna 102 includes a coaxial feed that is used to provide a cylindrical wave feed via an input feed, such as, for example, described in U.S. Pat. No. 9,887,456, entitled "Dynamic Polarization and Coupling Control from a Steerable Cylindrically Fed Holographic Antenna", issued Feb. 6, 2018 or in U.S. Patent Application Publication No. 20210050671, entitled "Metasurface Antennas Manufactured with Mass Transfer Technologies," published Feb. 18, 2021. In some embodiments, the cylindrical wave feed feeds core antenna 102 from a central point with an excitation that spreads outward in a cylindrical manner from the feed point. In other words, the cylindrically fed wave is an outward travelling concentric feed wave. Even so, the shape of the cylindrical feed antenna around the cylindrical feed can be circular, square or any shape. In some other embodiments, a cylindrically fed antenna aperture creates an inward travelling feed wave. In such a case, the feed wave most naturally comes from a circular structure.

In some embodiments, the core antenna comprises multiple layers. These layers include the one or more substrate layers forming the RF radiating antenna elements. In some embodiments, these layers may also include impedance matching layers (e.g., a wide-angle impedance matching (WAIM) layer, etc.), one or more spacer layers and/or dielectric layers. Such layers are well-known in the art.

Antenna support plate 103 is coupled to core antenna 102 to provide support for core antenna 102. In some embodiments, antenna support plate 103 includes one or more waveguides and one or more antenna feeds to provide one or more feed waves to core antenna 102 for use by antenna elements of core antenna 102 to generate one or more beams.

ACU 104 is coupled to antenna support plate 103 and provides controls for antenna 100. In some embodiments, these controls include controls for drive electronics for antenna 100 and a matrix drive circuitry to control a switching array interspersed throughout the array of RF radiating antenna elements. In some embodiments, the matrix drive circuitry uses unique addresses to apply voltages onto the tunable elements of the antenna elements to drive each antenna element separately from the other antenna elements. In some embodiments, the drive electronics for ACU 104 comprise commercial off-the shelf LCD controls used in commercial television appliances that adjust the voltage for each antenna element.

More specifically, in some embodiments, ACU 104 supplies an array of voltage signals to the tunable devices of the antenna elements to create a modulation, or control, pattern. The control pattern causes the elements to be tuned to different states. In some embodiments, ACU 104 uses the control pattern to control which antenna elements are turned on or off (or which of the tuning levels is used) and at which phase and amplitude level at the frequency of operation. The elements are selectively detuned for frequency operation by voltage application. In some embodiments, multistate control is used in which various elements are turned on and off to varying levels, further approximating a sinusoidal control pattern, as opposed to a square wave (i.e., a sinusoid gray shade modulation pattern).

In some embodiments, ACU 104 also contains one or more processors executing the software to perform some of the control operations. ACU 104 may control one or more sensors (e.g., a GPS receiver, a three-axis compass, a 3-axis accelerometer, 3-axis gyro, 3-axis magnetometer, etc.) to provide location and orientation information to the processor(s). The location and orientation information may be provided to the processor(s) by other systems in the earth station and/or may not be part of the antenna system.

Antenna 100 also includes a comm (communication) module 107 and an RF chain 108. Comm module 107 includes one or more modems enabling antenna 100 to communicate with various satellites and/or cellular systems, in addition to a router that selects the appropriate network route based on metrics (e.g., quality of service (QoS) metrics, e.g., signal strength, latency, etc.). RF chain 108 converts analog RF signals to digital form. In some embodiments, RF chain 108 comprises electronic components that may include amplifiers, filters, mixers, attenuators, and detectors.

Antenna 100 also includes power supply unit 105 to provide power to various subsystems or parts of antenna 100.

Antenna 100 also includes terminal enclosure platform 106 that forms the enclosure for the bottom of antenna 100. In some embodiments, terminal enclosure platform 106 comprises multiple parts that are coupled to other parts of antenna 100, including radome 101, to enclose core antenna 102.

Figure 2:
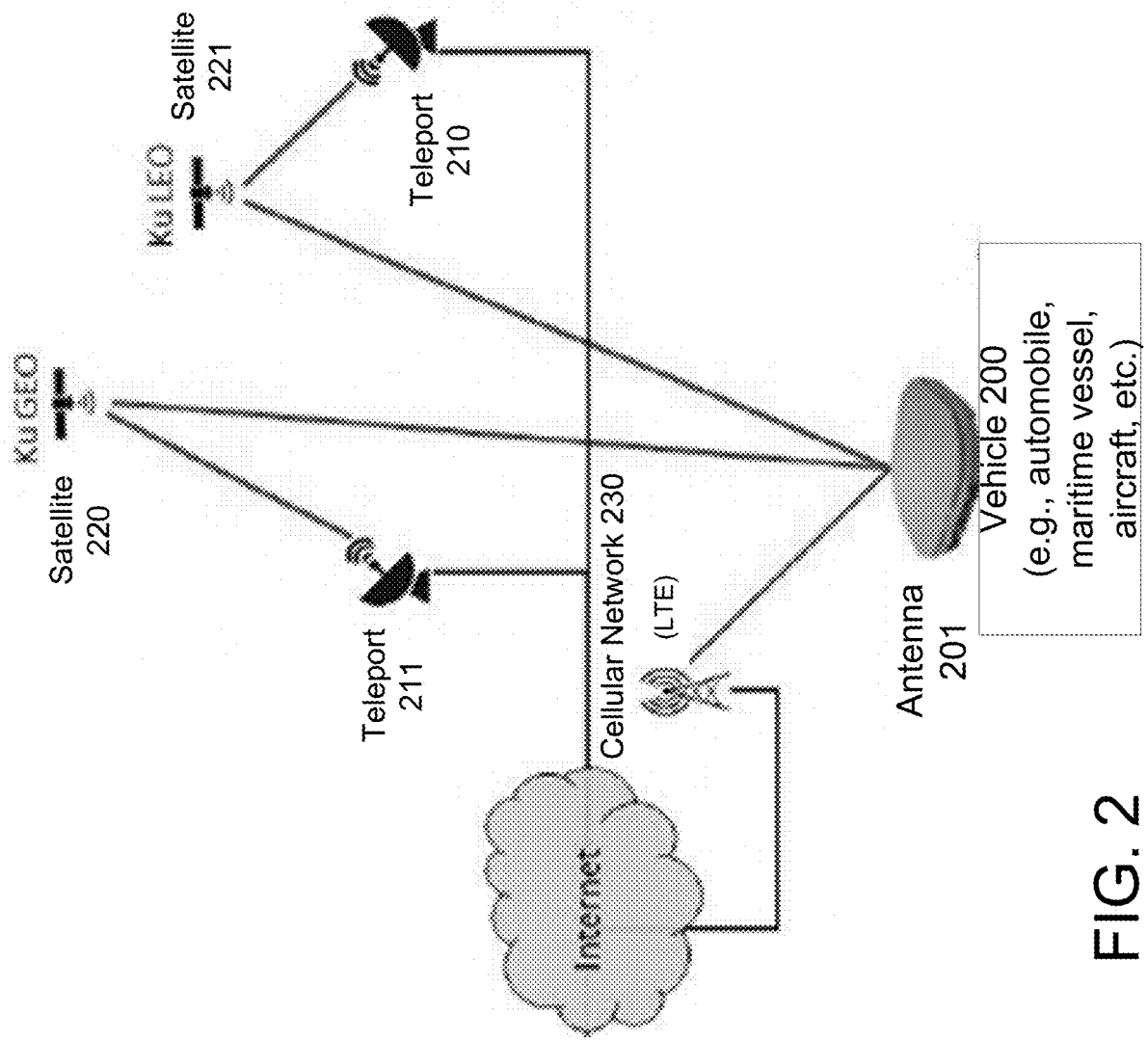
FIG. 2 illustrates an example of a communication system that includes one or more antennas described herein.

FIG. 2 illustrates an example of a communication system that includes one or more antennas described herein. Referring to FIG. 2, vehicle 200 includes an antenna 201. In some embodiments, antenna 201 comprises antenna 100 of FIG. 1.

In some embodiments, vehicle 200 may comprise any one of several vehicles, such as, for example, but not limited to, an automobile (e.g., car, truck, bus, etc.), a maritime vehicle (e.g., boat, ship, etc.), airplanes (e.g., passenger jets, military jets, small craft planes, etc.), etc. Antenna 201 may be used to communicate while vehicle 200 is either on-the-pause, or moving. Antenna 201 may be used to communicate to fixed locations as well, e.g., remote industrial sites (mining, oil, and gas) and/or remote renewable energy sites (solar farms, windfarms, etc.).

In some embodiments, antenna 201 is able to communicate with one or more communication infrastructures (e.g., satellite, cellular, networks (e.g., the Internet), etc.). For example, in some embodiments, antenna 201 is able to communication with satellites 220 (e.g., a GEO satellite) and 221 (e.g., a LEO satellite), cellular network 230 (e.g., an LTE, etc.), as well as network infrastructures (e.g., edge routers, Internet, etc.). For example, in some embodiments, antenna 201 comprises one or more satellite modems (e.g., a GEO modem, a LEO modem, etc.) to enable communication with various satellites such as satellite 220 (e.g., a GEO satellite) and satellite 221 (e.g., a LEO satellite) and one or more cellular modems to communicate with cellular network 230. For another example of an antenna communicating with one or more communication infrastructures, see U.S. patent Ser. No. 16/750,439, entitled "Multiple Aspects of Communication in a Diverse Communication Network", and filed Jan. 23, 2020.

In some embodiments, to facilitate communication with various satellites, antenna 201 performs dynamic beam steering. In such a case, antenna 201 is able to dynamically change the direction of a beam that it generates to facilitate communication with different satellites. In some embodiments, antenna 201 includes multi-beam beam steering that allows antenna 201 to generate two or more beams at the same time, thereby enabling antenna 201 to communication with more than one satellite at the same time. Such functionality is often used when switching between satellites (e.g., performing a handover). For example, in some embodiments, antenna 201 generates and uses a first beam for communicating with satellite 220 and generates a second beam simultaneously to establish communication with satellite 221. After establishing communication with satellite 221, antenna 201 stops generating the first beam to end communication with satellite 220 while switching over to communicate with satellite 221 using the second beam. For more information on multi-beam communication, see U.S. Pat. No. 11,063,661, entitled "Beam Splitting Hand Off Systems Architecture", issued Jul. 13, 2021.

In some embodiments, antenna 201 uses path diversity to enable a communication session that is occurring with one communication path (e.g., satellite, cellular, etc.) to continue during and after a handover with another communication path (e.g., a different satellite, a different cellular system, etc.). For example, if antenna 201 is in communication with satellite 220 and switches to satellite 221 by dynamically changing its beam direction, its session with satellite 220 is combined with the session occurring with satellite 221.

Thus, the antennas described herein may be part of a satellite terminal that enables ubiquitous communications and multiple different communication connections.

Optical Inspection Testing of Varactor Diodes

Embodiments disclosed herein use optical inspection of varactors diodes to detect faulty or disconnected components. In some embodiments, the optical inspection process tests varactor diodes on a metasurface antenna or antenna segments or any device, or part thereof, that is composed of many varactor diodes. For more information on antenna segments, see, for example, U.S. Pat. No. 9,887,455. In some embodiments, the varactor diodes of the device are individually and independently addressable through an active matrix and/or one or more transistors. In the present disclosure and claims that follow terms such as "faulty" or "defective" in relation to diodes or varactor diodes are intended to be interpreted broadly to encompass any condition impacting functionality of the diode including without limitation faulty or defective diodes, diode placement, diode connection, circuitry defects, and any other issue impacting the diode. For example, a diode may be considered faulty or defective when it does not emit light due to the diode not being able to perform its function as a diode, due to its placement being as part of an open circuit, due to its placement being as part of a short circuit, a driver (e.g., TFT circuit) to an antenna element that includes the diode is faulty.

In some embodiments, the optical inspection process uses a voltage source, backplane drive circuitry or a current source to drive the varactor diodes of a metasurface antenna or antenna segment in a forward bias state. In some embodiments, the optical inspection process uses a camera or an optical sensor that can sense and detect the visible (optical) or invisible (infrared) spectrum of the light that may be emitted by varactor diodes when in the forward biased state. This camera may be mounted on a robotic arm and performs a close-up scan of the device under test (e.g., antenna, antenna segment) which in one aspect can be stationary under the camera. In some alternative embodiments, the camera can be stationary, and the device under test is moved by a robotic arm when performing the inspection. Other relative positioning or motions are contemplated to be within the scope of the present disclosure. In either case, the camera takes images of the varactor diodes being tested and those images are processed to determine if the varactor diodes are faulty.

Figure 3:
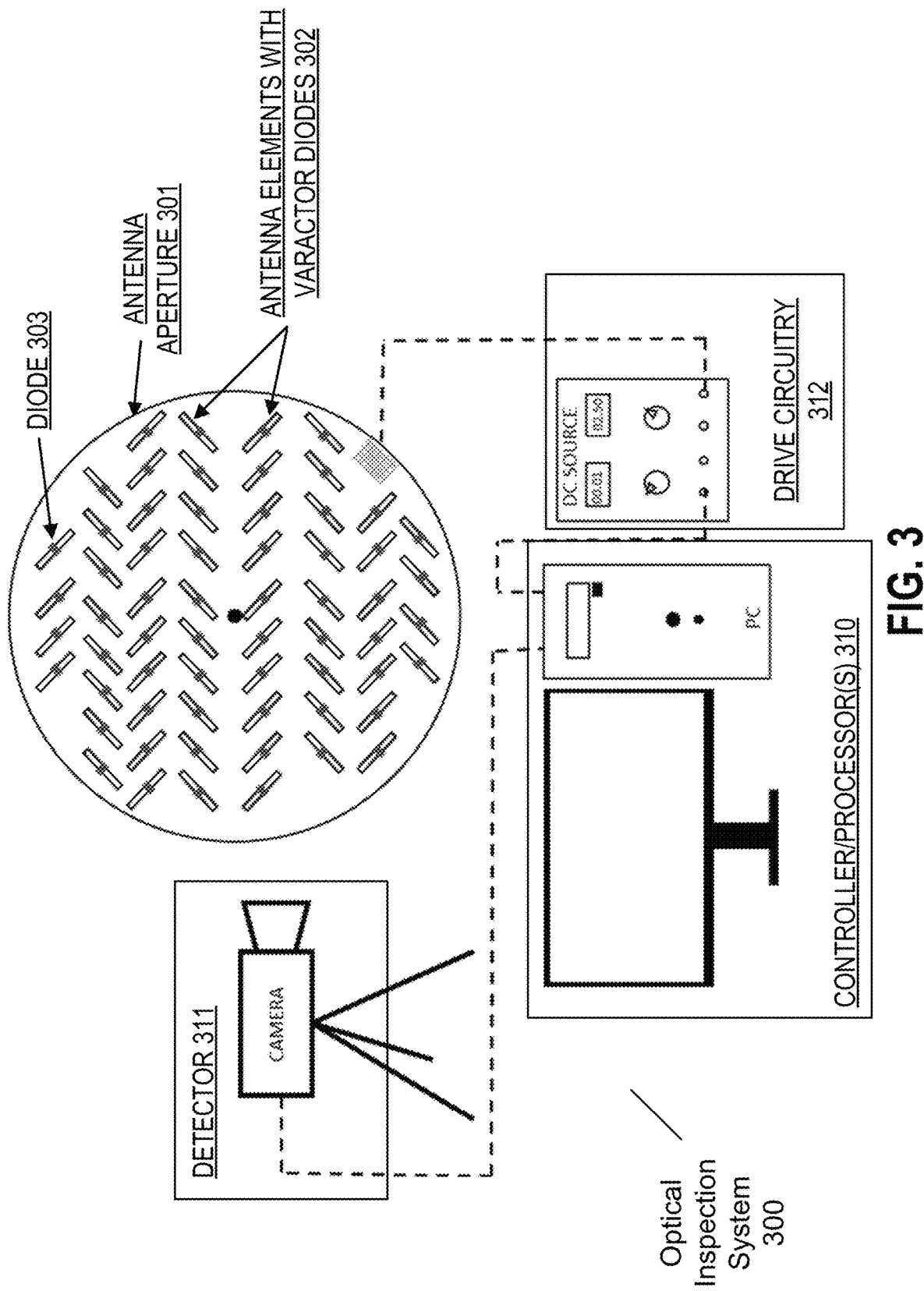
FIG. 3 illustrates some embodiments of an optical inspection system for use in testing devices with varactor diodes.

FIG. 3 illustrates some embodiments of an optical inspection system for use in testing devices with varactor diodes. In one embodiment, varactor diodes, such as varactor diodes 303, are tuning elements that are part of radio frequency (RF) radiating antenna elements 302, such as, for example, antenna elements of an antenna aperture 301. Antenna aperture 301 may be part of an antenna of a satellite terminal. In some other embodiments, the device may include a wafer that includes the varactor diodes.

Referring to FIG. 3, an optical inspection system 300 according to an embodiment comprises a controller 310, detector 311, and drive circuitry 312. In one aspect, the Controller 310 is operable to control the drive circuitry 312 and detector 311. During operation, detector 311 detects light emitted by the varactor diodes of antenna elements 302. In some embodiments, detector 311 comprises a camera or optical sensor or a combination thereof. In the case of a camera, detector 311 takes an image of antenna elements 302 and sends the image to controller 310 for processing.

Drive circuitry 312 is configured or operable to drive the varactor diodes of antenna elements 302 into a forward biased state. In some embodiments, drive circuitry 312 comprises a voltage source, a backplane drive circuitry, or a current source. When the varactor diodes are forward biased to a certain voltage level, non-faulty varactor diodes emit light. Detector 311 detects the light emitted from any of the varactor diodes when they are in the forward biased state. In the case where detector 311 includes a camera, detector 311 captures an image of the varactor diodes in the forward biased state and sends or communicates the image to controller 310 for processing.

In some embodiments, controller 310 comprises one or more processors to process the image or any data obtained from detector 311 to determine which, if any, of the varactor diodes are faulty. In some embodiments, controller 310 comprises a computer, such as a personal computer, or other computing device. The personal computer or computing device may include a display.

In some embodiments, controller 310 determines which, if any, of the varactor diodes 303 are faulty based on whether the varactor diodes 303 emit light. In other words, after being forward biased, if a particular varactor diode does not emit light or emits light only of a certain intensity level less than a threshold, then controller 310 determines that the varactor diode is faulty and not working properly.

In some embodiments, drive circuitry 312 can be incorporated into the device being tested. For example, drive circuitry 312 may be incorporated into antenna aperture 301. Drive circuitry 312 may be part of an antenna control unit. In such a case, the antenna control unit can be designed to support a higher-level current consumption where all the varactor diodes that are part of antenna elements 302 are forward-biased at the same time. This may entail routing specific power rails to the antenna substrate for distributing the voltage needed for forward biasing varactor diodes and using a particular power supply to supply power to common voltage lines for forward biasing the varactor diodes. In some embodiments, the trace widths are selected to ensure they can carry the needed current and to minimize the voltage drop, and the power supply is selected to cover and provide the required level of voltage and current.

Figure 4:
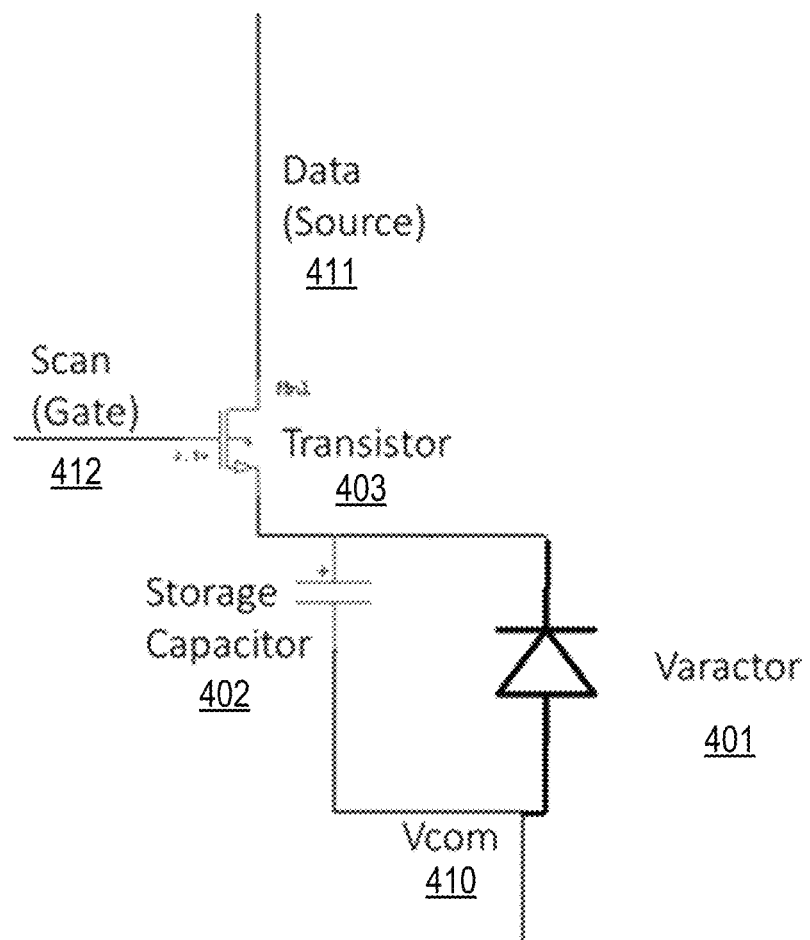
FIG. 4 illustrates some embodiments of a metasurface antenna pixel circuit that facilitates the testing of varactor diodes.

FIG. 4 illustrates some embodiments of a metasurface antenna pixel circuit that facilitates the testing of varactor diodes. In some embodiments, the metasurface antenna pixel circuit is within an active-matrix drive circuitry used to drive antenna elements (e.g., RF radiating antenna elements) of an antenna aperture. Referring to FIG. 4, varactor diode 401 is in electronic communication with or connected in parallel to the storage capacitor 402. An input terminal of varactor diode 401 is coupled to a common voltage (Vcom) 410 and a first terminal of storage capacitor 402. An output terminal of varactor diode 401 and a second terminal of storage capacitor 402 are in electronic communication with or coupled to a drain terminal of transistor 403. In some embodiments, source terminal 411 of transistor 403 is coupled to a data signal while gate 412 of transistor 403 is coupled to a scan input.

In some embodiments, when a varactor diode, such as varactor diode 401, is tested, Vcom 410 applies a voltage to varactor diode 401. During normal antenna operation of the antenna element, the pixel circuit of FIG. 4 only applies a reverse bias voltage to varactor diode 401 as the data voltage on source 411 is higher than or equal to Vcom voltage 410. However, the voltage polarity is reversed during the inspection or testing process so that Vcom voltage 410 is higher than the data voltage on source 411 which forward biases varactor diode 401. In some embodiments, the difference in voltage between Vcom voltage 410 and the data voltage on source terminal 411 during forward biasing is 15-20 volts.

In some embodiments, the inspection process can also use a current source instead of a voltage source. This can be done using driver integrated circuits (ICs) already used for controlling the metasurface antenna backplane or a test setup specifically designed for testing based on current requirements. In one controlled test, an "ON" signal is applied to gate terminal 412 of the pixel under test and the current source is connected between Vcom voltage 410 and source (data) terminal 411 of the pixel under test in order to drive a current from the Vcom 410 terminal.

To detect the faulty varactors, several different tests may be performed by the optical inspection systems disclosed herein depending on the required speed and/or accuracy of the optical inspection system. The following three are non-limiting examples. In a first test, all the varactor diodes in the metasurface antenna are set to forward bias and the entire metasurface is scanned at the same time. In a second test, all the varactor diodes in one segment or any arbitrary region in the antenna are put to a light emitting state and the inspection is performed. Third, any arbitrary number of varactor diodes in any arbitrary location of the antenna are set to a forward bias voltage and the optical inspection is done.

The scenarios described above can also be applied when a switching signal is applied to the selected varactor diodes in each case. This signal switches the varactor diodes between their on (light emitting) and off (not light emitting) states to verify that the active matrix is able to control the varactor diodes, that the pixel transistor is not shorted and that the leakage through the transistor doesn't cause performance degradation.

In some other embodiments, the light intensity from any selected varactor diode or diodes can be measured by varying the applied current to the varactor diode in its forward bias state. This measurement would employ a current source as part of the drive circuitry.

To achieve any of the aforementioned scenarios, an individual varactor in the metasurface setting is addressed independently by the active-matrix drive that includes transistors. The desired voltage or current is applied by the active-matrix driver ICs and those ICs communicate with a computer. Then the same (or another) computer commands, for example via a protocol or algorithm, a camera/sensor to inspect the surface of the antenna by capturing the optical and/or infrared image of the metasurface and processing the images to detect the faulty varactors.

In some other embodiments, the varactor diodes may be inspected before they are assembled onto the metasurface backplane (or another device). This test would not require an active-matrix to individually address each varactor diode and it is intended as a quick verification that each varactor diode is turning on when they are still on a wafer and before being diced into chips.

In some embodiments, to test varactor diodes on a wafer, all the anodes of the varactor diodes under test are connected to an anode test terminal and all the cathodes of the varactors under test are connected to a cathode test terminal on the wafer. Then a predetermined turn on voltage (or current) is applied between the anode and cathode test terminals to forward bias all of the varactor diodes to set all the varactors into the light emitting state. Any varactor diode that is not emitting light will be considered as failed and not used for the particular application, for example for the antenna or other device.

Figure 5:
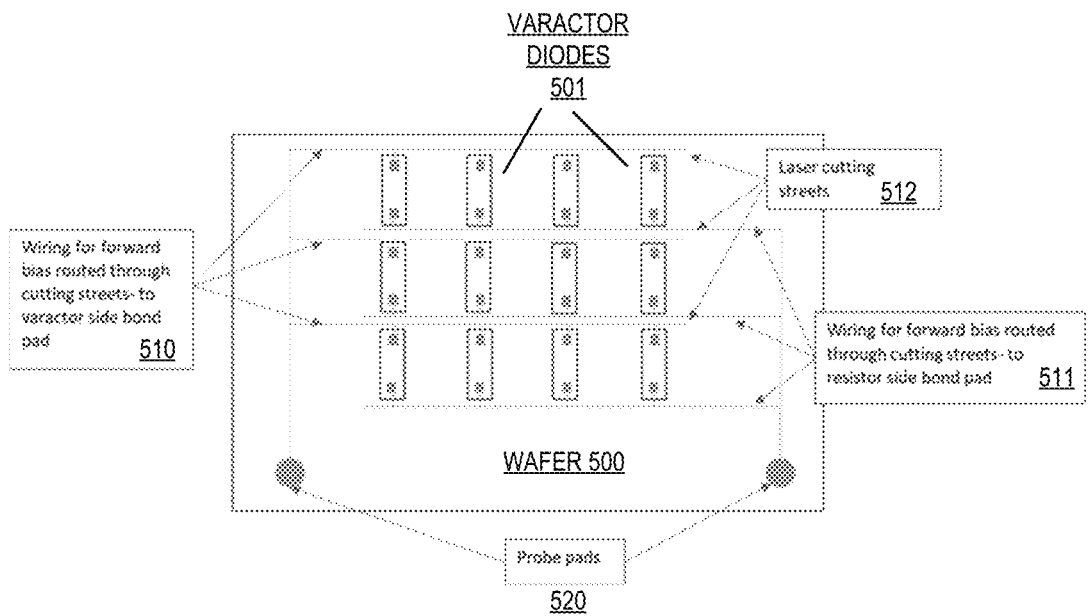
FIG. 5 illustrates some embodiments of a schematic showing how diodes are forward biased on the wafer before dicing.

FIG. 5 illustrates some embodiments of a schematic showing how diodes are forward biased on the wafer before dicing. Referring to FIG. 5, wafer 500 includes rows of varactor diodes, such as varactor diodes 501. Wafer 500 includes wiring 510 for forward biased routing through laser cut streets 512 to varactor side bond pads. Wafer 500 also includes wiring 511 for forward biased routing through cutting streets 512 to resistor side bond pads. Wafer 510 includes probe pads 520 connected to wiring 510 and 511 to which voltages can be supplied to put each of varactor diodes 501 into a forward biased state for testing. Once forward biased, each of the varactor diodes can be inspected to determine whether they emit light. If they emit light, the varactor diodes are considered to be operating correctly, while varactor diodes that do not emit light are considered faulty. In some embodiments, whether the varactor diodes emit light is based on whether the light emitted by the varactor diode is above or below a predetermined light intensity level (i.e., a threshold).

In the embodiment of FIG. 5, the varactors are connected in parallel in this setting. The same or similar test can be performed when varactor diodes are connected in series, but one failed varactor will cause all varactors not to emit light and by mistake be considered as broken. To accommodate this test, in some embodiments, traces can be created for connecting varactor diodes in parallel and the traces are removed before the varactor diodes are diced into chips. That requires additional processing steps. The fault detection and image processing steps of this quick test can be the same as or similar to that described in relation to the other test(s) described above. In some embodiments, the fault detection is performed by an optical inspection system 550 (e.g., optical inspection system 300 of FIG. 3).

In some embodiments, as a result of testing, a file or map can be created that indicates which of the varactor diodes on a wafer are faulty. For example, file 551 may be created by optical inspection system 550. The file may include addresses of varactor diodes that are faulty and should not be used. Such a file may be used by a pick and place machine during manufacturing to indicate which varactor diodes from a wafer should be included in a device (e.g., an antenna) being manufactured. In this way, faulty varactor diodes do not become part of a manufactured device.

Example Flow Diagrams

Figure 6:
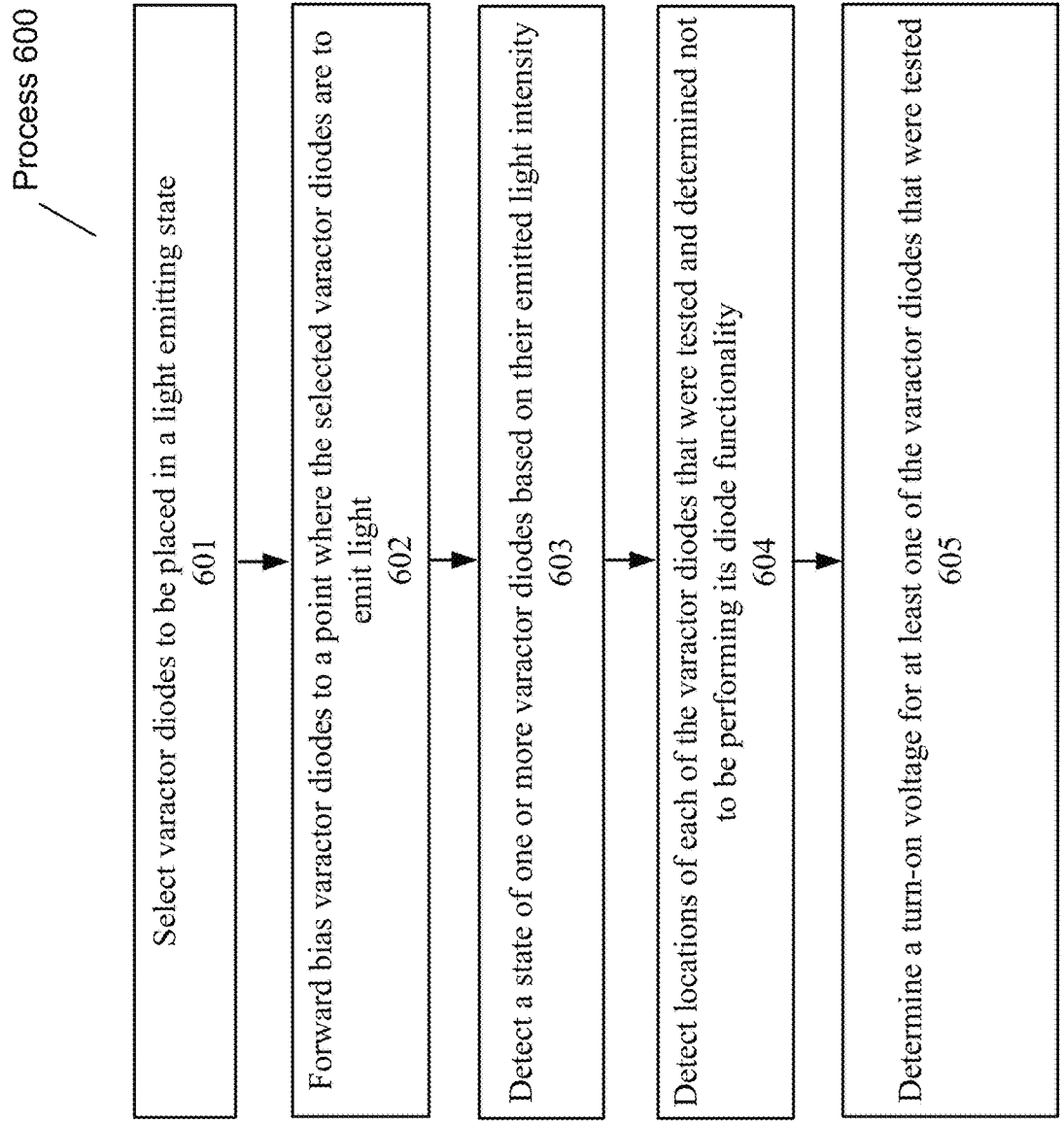
FIG. 6 is a flow diagram of some embodiments of a process for performing optical inspection for detecting faulty varactor diodes.

FIG. 6 is a flow diagram of some embodiments of a process 600 for performing optical inspection for detecting faulty varactor diodes. In some embodiments, the process 600 is performed by a processing logic that may comprise hardware (circuitry, dedicated logic, etc.), software (e.g., software running on a chip), firmware, or a combination thereof or all three. In some embodiments, the process 600 is performed by an optical inspection system, such as, for example, the system 300 described above in relation to FIG. 3. In some embodiments, the optical inspection process 600 can be applied for testing varactor diodes on a device such as, for example, a metasurface antenna or antenna aperture. In some other embodiments, the optical inspection process can be applied for testing varactor diodes on a wafer.

Referring to FIG. 6, the process 600 begins by processing logic selecting varactor diodes to be placed in a light emitting state (processing block 601). Next, processing logic forward biases varactor diodes to a point where the selected varactor diodes are to emit light (processing block 602). In some embodiments, forward biasing the varactor diodes to a point where the varactor diodes are to emit light comprises driving a common voltage (e.g., Vcom) at an input of each of the varactor diodes, where the common voltage is higher than a data source voltage coupled to the output of those varactor diodes. In some embodiments, the pixel circuit in FIG. 4 can be used when performing this forward biasing.

Thereafter, processing logic detects a state of one or more varactor diodes based on their emitted light intensity (processing block 603). In some embodiments, detecting the state of the varactor diodes is based on the emitted light intensity being less than a threshold. In some other embodiments, the state of a varactor diode is indicative of the varactor diode is not performing its function properly or as intended in its application. In some other embodiments, the state of a varactor diode is indicative of the varactor diode being faulty or defective. In some other embodiments, the state of a varactor diode is indicative of the varactor diode being faulty or defective and/or that the varactor diode is not performing its function properly (e.g., it's part of an open circuit (e.g., its partially disconnected,) it's part of a short circuit, the driver circuit that drives a voltage to the varactor diode is not functioning correctly to enable the varactor diode to function correctly, etc.).

In some embodiments, the process 600 of FIG. 6 also includes detecting locations of each of the varactor diodes that were tested and not functioning properly (processing block 604). In some embodiments, the process 600 also includes determining a turn-on voltage for one or more varactor diodes that were tested (processing block 605). In some embodiments, this determination is based on when each of the non-faulty varactor diodes emitted light that reached a light intensity threshold.

Figure 7:
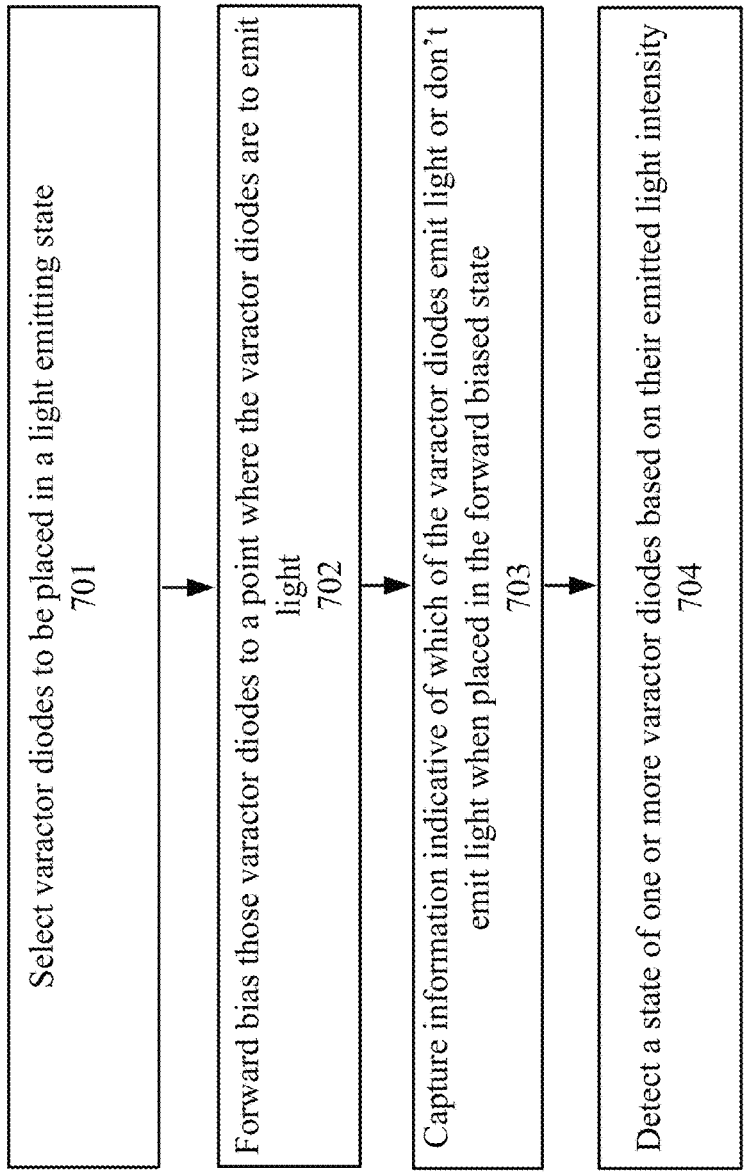
FIG. 7 is a flow diagram of some other embodiments of a process for performing optical inspection of varactor diodes.

FIG. 7 is a flow diagram of some other embodiments of a process 700 for performing optical inspection of varactor diodes. In some embodiments, the process is performed by a processing logic that may comprise hardware (circuitry, dedicated logic, etc.), software (e.g., software running on a chip), firmware, or a combination thereof or all three. In some embodiments, the process 700 is performed by an optical inspection system, such as, for example, the system 300 described above in relation to FIG. 3. In some embodiments, the optical inspection process 700 can be applied for testing varactor diodes on a device such as, for example, a metasurface antenna or antenna aperture. In some other embodiments, the optical inspection process 700 can be applied for testing varactor diodes on a wafer.

Referring to FIG. 7, the process 700 begins by a processing logic selecting varactor diodes to be placed in a light emitting state (processing block 701) and forward biasing those varactor diodes to a point where the varactor diodes are to emit light (processing block 702). Next, processing logic captures information indicative of which of the varactor diodes emit light or don't emit light when placed in the forward biased state (processing block 703). In some embodiments, capturing information indicative of which varactor diodes emit light or not comprises capturing sensor data indicating emitted light intensity of the varactor diodes that have been forward biased. In some other embodiments, capturing information indicative of which varactor diodes emit light or not comprises recording an image with a camera and processing the image to determine which varactor diodes emit light or not. Processing logic then detects a state of one or more varactor diodes based on their emitted light intensity (processing block 704). In some other embodiments, the state of a varactor diode is indicative of the varactor diode is not performing its function properly or as intended in its application. In some other embodiments, the state of a varactor diode is indicative of the varactor diode being faulty or defective. In some other embodiments, the state of a varactor diode is indicative of the varactor diode being faulty or defective and/or that the varactor diode is not performing its function properly (e.g., it's part of an open circuit (e.g., its partially disconnected,) it's part of a short circuit, the driver circuit that drives a voltage to the varactor diode is not functioning correctly to enable the varactor diode to function correctly, etc.).

Figure 8:
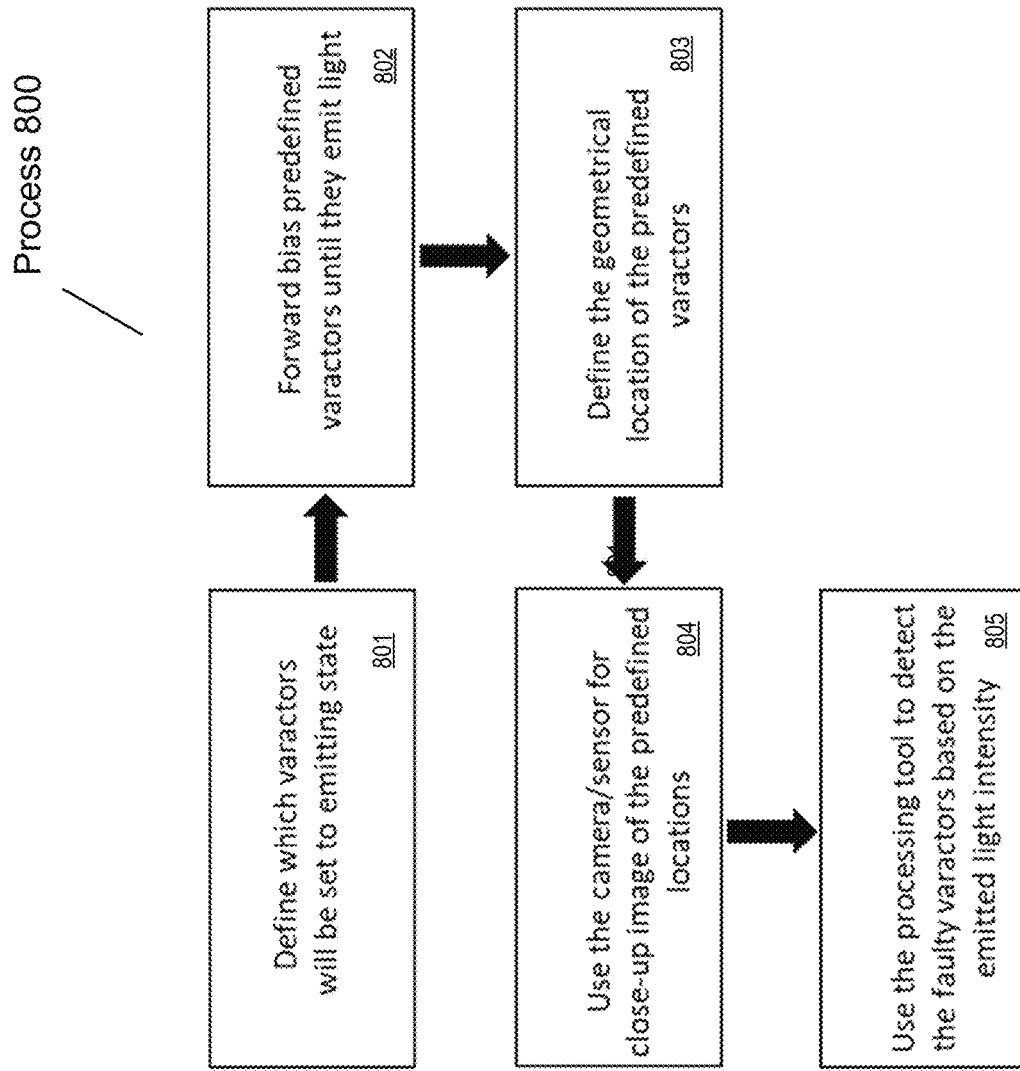
FIG. 8 is a flow diagram of yet some other embodiments of an optical inspection process for testing varactor diodes.

FIG. 8 is a flow diagram of yet some other embodiments of an optical inspection process 800 for testing varactor diodes. In some embodiments, the process 800 is performed by a processing logic that may comprise hardware (circuitry, dedicated logic, etc.), software (e.g., software running on a chip), firmware, or a combination thereof or all three. In some embodiments, the process 800 is performed by an optical inspection system, such as, for example, the system 300 described above in relation to FIG. 3. In some embodiments, the optical inspection process 800 can be applied for testing varactor diodes on a device such as, for example, a metasurface antenna or antenna aperture. In some other embodiments, the optical inspection process 800 can be applied for testing varactor diodes on a wafer.

Referring to FIG. 8, the process 800 begins by defining which varactor diodes will be set to an emitting state (processing block 801) and forward biasing those predefined varactor diodes until they emit light (processing block 802).

Next, processing logic defines a geometrical location of those predefined varactor diodes (processing block 803) and then uses a camera or optical sensor to take an image, such as a close-up image, of the predetermined locations (processing block 804). In this way, the image indicates which of the varactor diodes emit light over certain intensity or not. Thereafter, processing logic uses a processing tool (e.g., one or more processors, etc.) to detect faulty varactors in the predefined set of varactor diodes based on the emitted light intensity (processing block 805). In some embodiments, the emitted light intensity is based on whether the varactor diode emits any light or not. In some other embodiments, the emitted light intensity is based on whether the emitted light intensity is above a predetermined threshold. In some embodiments, the predefined emitted light intensity threshold may cause some varactor diodes that do emit light to be considered faulty because the light that is emitted does not reach the emitted light intensity threshold.

Figure 9:
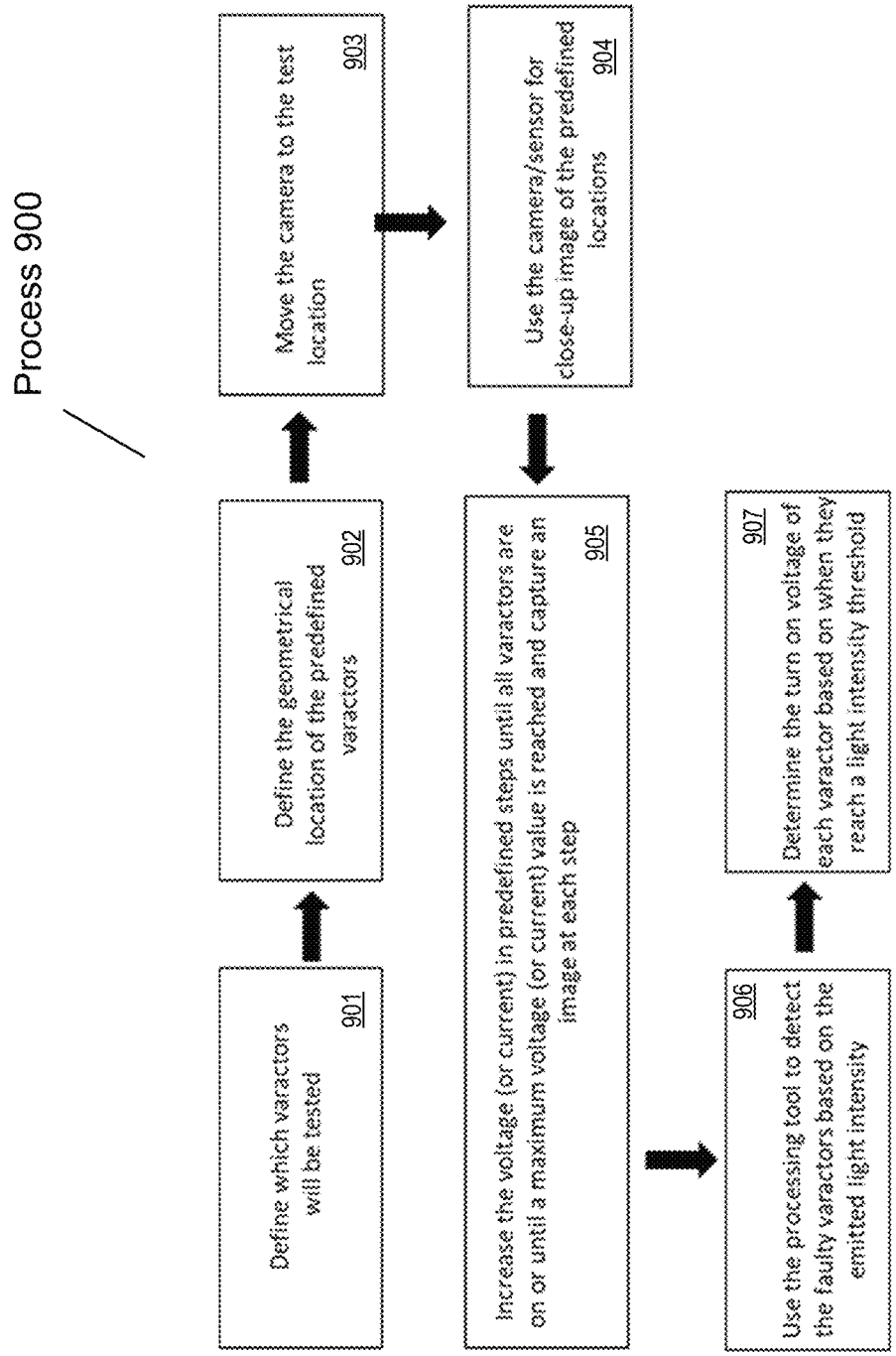
FIG. 9 is still yet another embodiment of an optical inspection process for determining the quality of varactor diodes in a device.

FIG. 9 is still yet another embodiment of an optical inspection process 900 for determining the quality of varactor diodes in a device. In some embodiments, the process 900 is performed by a processing logic that may comprise hardware (circuitry, dedicated logic, etc.), software (e.g., software running on a chip), firmware, or a combination thereof or all three. In some embodiments, the process 900 is performed by an optical inspection system, such as, for example, the system 300 described above in relation to FIG. 3. In some embodiments, the optical inspection process is for testing varactor diodes on a device such as, for example, a metasurface antenna or antenna aperture. In some other embodiments, the optical inspection process is for testing varactor diodes on a wafer.

Refer to FIG. 9, the process 900 begins by defining which varactors diodes of the device will be tested (processing block 901) and defining the geometric location of the predefined set of varactors there to be tested (processing block 902). Once this is finished, processing logic operates or commands to move a camera or sensor to a test location (processing block 903). In some embodiments, the processing logic moves the camera to a test location using a robotic arm or other automated tool.

Once the camera has been moved to the test location, processing logic then uses or commands the camera or sensor to take an image, for example a close-up image, of the predefined locations (processing block 904). At this point, processing logic increases the voltage (or current) in predefined steps until all the varactor diodes that are to be tested are on or until a maximum voltage (or current) value is reached and captures an image at each step (processing block 905).

In some embodiments, processing logic then uses a processing tool to detect faulty varactor diodes that are in the varactors being tested based under emitted light intensity (processing block 906). In some embodiments, the emitted light intensity is based on whether the varactor diode emits any light or not. In some other embodiments, the emitted light intensity is based on whether the emitted light intensity is above a predetermined threshold. In some embodiments, the predefined emitted light intensity threshold may cause some varactor diodes that do emit light to be considered faulty because the light that is emitted does not reach the emitted light intensity threshold.

In some embodiments, processing logic determines a turn on voltage of each varactor diode based on when each varactor diode reached the light intensity threshold (processing block 907). In some embodiments, this determination is made using the images taken at each of the predefined steps under which the voltage was increased. In other words, as the voltages were increased, certain varactor diodes would start to emit light. This would indicate their turn on voltage.

Embodiments of the disclosed optical inspection techniques have one or more advantages/improvements compared to the DC/RF method or FST methods of the prior art. First, the techniques described herein are useful to determine the faulty and broken varactors in the antenna setting before and after being assembled on an antenna aperture (e.g., a metasurface, etc.). Most of the prior art DC/RF tests for quality assurance of varactor diodes are based on the measurements of the singulated varactor diodes before being assembled on the antenna. Additional tests, such as free space test (FST), may be performed after the varactor diodes are assembled into a metasurface segment or an antenna but these tests provide information from only a group of RF elements/varactors. However, optical inspection techniques described herein are based on a forward bias mode of the varactor diode and can be done on an individual varactor diode that has been assembled already and detects the individual performance of each varactor diode. Additionally, the non-functioning varactors can be replaced after the fault detection has occurred.

Second, embodiments of the optical inspection process disclosed herein are faster because the varactor diodes on each metasurface antenna/segments can be tested concurrently, while in the DC/RF method the testing occurs individually or only in small groups as with the FST method. Third, embodiments of the optical inspection processes disclosed herein allow the freedom to individually select faulty/broken varactor diodes. In contrast, if using the FST method, only the relative performance of the group of varactor diodes compared to the adjacent group are evaluated. Fourth, embodiments of the optical inspection techniques disclosed herein are performed at the antenna or segment level (after all the varactor diodes have been assembled on the metasurface), while the DC/RF test are done before the varactor diodes have been assembled. Furthermore, embodiments of the optical inspection techniques disclosed herein provide performance information for both the varactor diode and the pixel circuit. For example, using the techniques disclosed herein, a determination may be made as to all the faulty/broken varactor diodes in the metasurface antenna. Moreover, the location of the individual faulty varactor diodes may also be specified.

In addition, due to the vast number of varactors or varactor diodes that are used in each antenna individual inspection of the varactor diodes is impractical. However, the techniques disclosed herein make the inspection procedure fast, efficient and reliable with higher accuracy. Therefore, embodiments of the present disclosure make the quality assurance process for an antenna efficient, faster, and more accurate and reliable.

An Example of a Computer System

Figure 10:
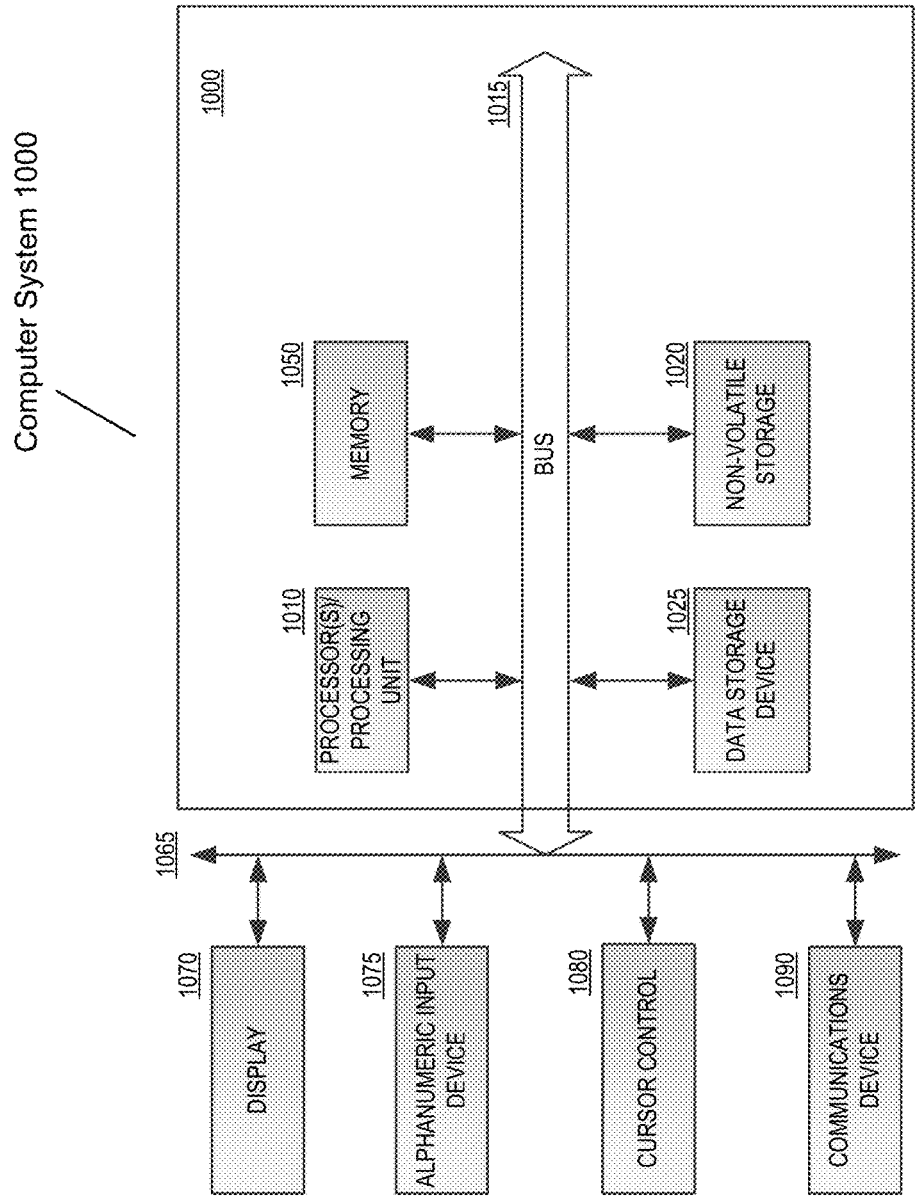
FIG. 10 is some embodiments of a computer system that may be used to support the systems and operations discussed herein.

FIG. 10 illustrates some embodiments of a computer system 1000 that may be used or is operable to support the systems and operations discussed herein. It will be apparent to those of ordinary skill in the art, however that other alternative systems of various system architectures may also be used.

The data processing system 1000 illustrated in FIG. 10 includes a bus or other internal communication means 1015 for communicating information, and a processor(s) 1010 coupled to the bus 1015 for processing information. The system further comprises a random-access memory (RAM) or other volatile storage device 1050 (referred to as memory), coupled to bus 1015 for storing information and instructions to be executed by processor 1010. Main memory 1050 also may be used for storing temporary variables or other intermediate information during execution of instructions by processor(s) 1010. The system also comprises a read only memory (ROM) and/or static storage device 1020 coupled to bus 1015 for storing static information and instructions for processor 1010, and a data storage device 1025 such as a magnetic disk or optical disk and its corresponding disk drive. Data storage device 1025 is coupled to bus 1015 for storing information and instructions.

The system 1000 may further be coupled to a display device 1070, such as a light emitting diode (LED) display or a liquid crystal display (LCD) coupled to bus 1015 through bus 1065 for displaying information to a computer user. An alphanumeric input device 1075, including alphanumeric and other keys, may also be coupled to bus 1015 through bus 1065 for communicating information and command selections to processor 1010. An additional user input device is cursor control device 1080, such as a touchpad, mouse, a trackball, stylus, or cursor direction keys coupled to bus 1015 through bus 1065 for communicating direction information and command selections to processor 1010, and for controlling cursor movement on display device 1070.

Another device, which may optionally be coupled to computer system 1000 in some embodiments, is a communication device 1090 for accessing other nodes of a distributed system via a network. The communication device 1090 may include any of a number of commercially available networking peripheral devices such as those used for coupling to an Ethernet, token ring, Internet, or wide area network. The communication device 1090 may further be a null-modem connection, or any other mechanism that provides connectivity between the computer system 1000 and the outside world. Note that any or all of the components of this system illustrated in FIG. 10 and associated hardware may be used in various embodiments as discussed herein.

In some embodiments, processor(s) 1010 generates control signals and information for drive circuitry to cause a voltage source, current source or backplane voltage to be provided to varactor diodes and/or antenna elements with associated varactor diodes, for a detector to obtain data related to which varactor diodes emitted light, for image or sensor data processing logic to process images and/or sensor data from a detector for identifying emitted light intensity, if any, for each varactor diode being forward biased, for determining which varactor diodes are faulty and/or their location, for determining turn on voltages of varactor diodes, and/or for any other operations described herein.

It will be appreciated by those of ordinary skill in the art that any configuration of the system may be used for various purposes according to the particular implementation. The control logic or software implementing the described embodiments can be stored in main memory 1050, mass storage device 1025, or other storage medium locally or remotely accessible to processor 1010.

It will be apparent to those of ordinary skill in the art that the system, method, and process described herein can be implemented as software stored in main memory 1050 or read only memory 1020 and executed by processor 1010. This control logic or software may also be resident on an article of manufacture comprising a computer readable medium having computer readable program code embodied therein and being readable by the mass storage device 1025 and for causing the processor 1010 to operate in accordance with the methods and teachings herein.

The embodiments discussed herein may also be embodied in a special purpose appliance including a subset of the computer hardware components described above. For example, the appliance may include a processor 1010, a data storage device 1025, a bus 1015, and memory 1050, and only rudimentary communications mechanisms, such as a small touch-screen that permits the user to communicate in a basic manner with the device. In general, the more special-purpose the device is, the fewer of the elements need be present for the device to function.

There are a number of example embodiments described herein.

Example 1 is a method of testing an antenna having varactor diodes, where the method comprises: selecting a plurality of varactor diodes to be placed in a light emitting state; forward biasing the selected varactor diodes to a magnitude at which the selected varactor diodes are to emit light; and detecting a state of each of one or more varactor diodes of the selected varactor diodes based on their emitted light intensity.

Example 2 is the method of example 1 that may optionally include that detecting the state of one or more varactor diodes includes determining one or more varactor diodes of the selected varactor diodes are not performing varactor diode functionality based on the emitted light intensity being less than a threshold.

Example 3 is the method of example 1 that may optionally include that detecting the state of one or more varactor diodes includes determining one or more varactor diodes of the selected varactor diodes are faulty based on the emitted light intensity being less than a threshold.

Example 4 is the method of example 1 that may optionally include capturing information indicative of which varactor diodes of the selected varactor diodes emit light or don't emit light when placed in a forward biased state.

Example 5 is the method of example 4 that may optionally include that capturing information comprises capturing sensor data indicating emitted light intensity of varactor diodes in the selected varactor diodes.

Example 6 is the method of example 4 that may optionally include that capturing information comprises recording an image and processing the image to determine which varactor diodes of the selected varactors emit light.

Example 7 is the method of example 1 that may optionally include that forward biasing the selected varactor diodes to a magnitude at which the selected varactor diodes are to emit light comprises driving a common voltage at an input of each of the selected varactor diodes higher than a data source voltage coupled to an output of said each of the selected varactor diodes.

Example 8 is the method of example 1 that may optionally include determining a turn-on voltage for at least one varactor diode of the plurality of varactor diodes based on when said at least one varactor diode emitted light that reached a light intensity threshold.

Example 9 is the method of example 1 that may optionally include detecting a location of each of the one or more faulty varactor diodes.

Example 10 is the method of example 1 that may optionally include that selecting a plurality of varactor diodes to be placed in a light emitting state and forward biasing the selected varactor diodes to a magnitude at which the selected varactor diodes are to emit light are performed on each varactor diode in the selected varactor diodes one at a time.

Example 11 is the method of example 1 that may optionally include that the state of each of one or more varactor diodes is indicative of whether said each of the one or more varactor diodes performs its function as a varactor diode properly.

Example 12 is a testing system to test a device with a plurality of varactor diodes, the testing system comprising: drive circuitry to drive the plurality of varactor diodes into a forward biased state; a detector configured to detect light emitted from any of the plurality of varactor diodes in response to the plurality of varactor diodes being forward biased; at least one processor coupled to receive data detected by the detector and determine if any of the plurality of varactor diodes are not performing its varactor diode functionality based on the data; and a controller operatively coupled to control the drive circuitry, the detector and the at least one processor to test the plurality of varactor diodes to determine if any are not performing their varactor diode functionality.

Example 12 is the testing system of example 12 that may optionally include that the plurality of varactor diodes are part of an antenna aperture or a segment of an antenna aperture.

Example 14 is the testing system of example 12 that may optionally include that the plurality of varactor diodes are part of a wafer.

Example 15 is the testing system of example 12 that may optionally include that the detector comprises at least one of a camera and an optical sensor.

Example 16 is the testing system of example 15 that may optionally include that the at least one processor comprises an image processor to process an image generated by the detector.

Example 17 is the testing system of example 12 that may optionally include that the drive circuitry comprises one or more of a voltage source, a backplane drive circuitry, and a current source.

Example 18 is the testing system of example 12 that may optionally include that the controller comprises a computer system.

Example 19 is a method comprising: selecting varactor diodes to be placed in a light emitting state; determining a location of the selected varactor diodes; forward biasing the selected varactor diodes to a point where the selected varactor diodes emit light, including increasing a voltage applied to the selected varactor diodes until each varactor diode of the selected varactor diodes is on or until a maximum voltage threshold is reached; capturing an image of the selected varactor diodes at the location; and detecting a state of one or more varactor diodes based on emitted light intensity.

Example 20 is the method of example 19 that may optionally include that the varactor diodes are part of an antenna aperture or a segment of an antenna aperture.

Example 21 is the method of example 19 that may optionally include that the varactor diodes are part of a wafer.

Example 22 is the method of example 20 that may optionally include generating a file with an address of each faulty varactor diode in the wafer for use in controlling a pick and place machine when manufacturing an antenna aperture with varactor diodes from the wafer.

Example 23 is the method of example 19 that may optionally include determining to turn on a voltage for each varactor diode in the selected varactor diodes based on when they reach a light intensity threshold.

Example 24 is the method of example 19 that may optionally include that detecting the state of the one or more varactor diodes includes determining whether each of the one or more varactor diodes are faulty based on the emitted light intensity being less than a threshold.

Some or all of the methods and tasks described herein may be performed and fully automated by a computer system. The computer system may, in some cases, include multiple distinct computers or computing devices (e.g., physical servers, workstations, storage arrays, cloud computing resources, etc.) that communicate and interoperate over a network to perform the described functions. Each such computing device typically includes a processor (or multiple processors) that executes program instructions or modules stored in a memory or other non-transitory computer-readable storage medium or device (e.g., solid state storage devices, disk drives, etc.). The various functions disclosed herein may be embodied in such program instructions, or may be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid-state memory chips or magnetic disks, into a different state. In some embodiments, the computer system may be a cloud-based computing system whose processing resources are shared by multiple distinct business entities or other users.

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware (e.g., ASICs or FPGA devices), computer software that runs on computer hardware, or combinations of both. Moreover, the various illustrative logical blocks and modules described in connection with the embodiments disclosed herein can be implemented or performed by a machine, such as a processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the rendering techniques described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements or steps. Thus, such conditional language is not generally intended to imply that features, elements or steps are in any way required for one or more embodiments or that one or more embodiments necessarily include logic for deciding, with or without other input or prompting, whether these features, elements or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, or Z). Thus, such disjunctive language is not generally intended to, and should not, imply that certain embodiments require at least one of X, at least one of Y, and at least one of Z to each be present.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

We claim:

1. A method of testing an antenna having varactor diodes, the method comprising:
    selecting a plurality of varactor diodes to be placed in a light emitting state;
    forward biasing the selected varactor diodes to a magnitude at which the selected varactor diodes are to emit light; and
    detecting a state of each of one or more varactor diodes of the selected varactor diodes based on their emitted light intensity.

2. The method of claim 1 wherein detecting the state of one or more varactor diodes includes determining one or more varactor diodes of the selected varactor diodes are not performing varactor diode functionality based on the emitted light intensity being less than a threshold.

3. The method of claim 1 wherein detecting the state of one or more varactor diodes includes determining one or more varactor diodes of the selected varactor diodes are faulty based on the emitted light intensity being less than a threshold.

4. The method of claim 1 further comprising capturing information indicative of which varactor diodes of the selected varactor diodes emit light or don't emit light when placed in a forward biased state.

5. The method of claim 4 wherein capturing information comprises capturing sensor data indicating emitted light intensity of varactor diodes in the selected varactor diodes.

6. The method of claim 4 wherein capturing information comprises recording an image and processing the image to determine which varactor diodes of the selected varactors emit light.

7. The method of claim 1 wherein forward biasing the selected varactor diodes to a magnitude at which the selected varactor diodes are to emit light comprises driving a common voltage at an input of each of the selected varactor diodes higher than a data source voltage coupled to an output of said each of the selected varactor diodes.

8. The method of claim 1 further comprising determining a turn-on voltage for at least one varactor diode of the plurality of varactor diodes based on when said at least one varactor diode emitted light that reached a light intensity threshold.

9. The method of claim 1 further comprising detecting a location of each of the one or more faulty varactor diodes.

10. The method of claim 1 wherein selecting a plurality of varactor diodes to be placed in a light emitting state and forward biasing the selected varactor diodes to a magnitude at which the selected varactor diodes are to emit light are performed on each varactor diode in the selected varactor diodes one at a time.

11. The method of claim 1 wherein the state of each of one or more varactor diodes is indicative of whether said each of the one or more varactor diodes performs its function as a varactor diode properly.

12. A testing system to test a device with a plurality of varactor diodes, the testing system comprising:
    drive circuitry to drive the plurality of varactor diodes into a forward biased state;
    a detector configured to detect light emitted from any of the plurality of varactor diodes in response to the plurality of varactor diodes being forward biased;
    at least one processor coupled to receive data detected by the detector and determine if any of the plurality of varactor diodes are not performing its varactor diode functionality based on the data; and a controller operatively coupled to control the drive circuitry, the detector and the at least one processor to test the plurality of varactor diodes to determine if any are not performing their varactor diode functionality.

13. The testing system of claim 12 wherein the plurality of varactor diodes are part of an antenna aperture or a segment of an antenna aperture.

14. The testing system of claim 12 wherein the plurality of varactor diodes are part of a wafer.

15. The testing system of claim 12 wherein the detector comprises at least one of a camera and an optical sensor.

16. The testing system of claim 15 wherein the at least one processor comprises an image processor to process an image generated by the detector.

17. The testing system of claim 12 wherein the drive circuitry comprises one or more of a voltage source, a backplane drive circuitry, and a current source.

18. The testing system of claim 12 wherein the controller comprises a computer system.

19. A method comprising:
selecting varactor diodes to be placed in a light emitting state;
determining a location of the selected varactor diodes;
forward biasing the selected varactor diodes to a point where the selected varactor diodes emit light, including increasing a voltage applied to the selected varactor diodes until each varactor diode of the selected varactor diodes is on or until a maximum voltage threshold is reached;
capturing an image of the selected varactor diodes at the location; and
detecting a state of one or more varactor diodes based on emitted light intensity.

20. The method of claim 19 wherein the varactor diodes are part of an antenna aperture or a segment of an antenna aperture.

21. The method of claim 19 wherein the varactor diodes are part of a wafer.

22. The method of claim 21 further comprising generating a file with an address of each faulty varactor diode in the wafer for use in controlling a pick and place machine when manufacturing an antenna aperture with varactor diodes from the wafer.

23. The method of claim 19 further comprising determining to turn on a voltage for each varactor diode in the selected varactor diodes based on when they reach a light intensity threshold.

24. The method of claim 19 wherein detecting the state of the one or more varactor diodes includes determining whether each of the one or more varactor diodes are faulty based on the emitted light intensity being less than a threshold.

* * * * *